(12) United States Patent
Ahn (10) Patent No.: US 7,776,669 B2
(45) Date of Patent: Aug. 17, 2010

(54) THIN FILM TRANSISTOR AND METHOD OF FABRICATING THE SAME

(75) Inventor: Ji-Su Ahn, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 83 days.

(21) Appl. No.: 11/863,824

(22) Filed: Sep. 28, 2007

(65) Prior Publication Data

US 2008/0111133 A1 May 15, 2008

(30) Foreign Application Priority Data

Nov. 10, 2006  (KR) ............... 10-2006-0111189

(51) Int. Cl.
*H01L 21/00* (2006.01)
*H01L 21/84* (2006.01)

(52) U.S. Cl. .............. 438/166; 438/151; 438/164; 438/165; 257/E21.316

(58) Field of Classification Search ........... 438/151, 438/152, 153, 154, 155, 156, 157, 158, 159, 438/160, 161, 162, 163, 164, 165, 166; 257/E21.316
See application file for complete search history.

(56) References Cited

U.S. PATENT DOCUMENTS

2005/0208710 A1* 9/2005 Isobe et al. ............. 438/149

FOREIGN PATENT DOCUMENTS

| JP | 2004-119919 | 4/2004 |
|---|---|---|
| KR | 2007-68046 | 6/2007 |

OTHER PUBLICATIONS

Decision to Grant issued on Dec. 24, 2007 in the corresponding Korean Patent application No. 2006-111189.

* cited by examiner

*Primary Examiner*—Matthew Smith
*Assistant Examiner*—John M Parker
(74) *Attorney, Agent, or Firm*—Stein McEwan, LLP

(57) ABSTRACT

A thin film transistor includes a substrate; a semiconductor layer disposed on the substrate, and including polycrystalline silicon having a constant directivity and a uniformly distributed crystal grain boundary; a gate insulating layer; a gate electrode; an interlayer insulating layer; and source and drain electrodes. The thin film transistor is formed by preparing a substrate including a first region, a second region, and a third region; forming an amorphous silicon layer on the first region, second region, and third region of the substrate; doping a first impurity containing boron into an amorphous silicon layer of the first region; forming a crystallization inducing material on the amorphous silicon layer of the first region; applying crystallization energy to the amorphous silicon layer, and crystallizing the amorphous silicon layers of the first region and the second region adjacent to the first region to form polycrystalline silicon layers; crystallizing the amorphous silicon layer of the third region adjacent to the second region to form a polycrystalline silicon layer using a laser crystallization method; and patterning the polycrystalline silicon layers of the first region, the second region, and the third region to form a semiconductor layer on the third region.

16 Claims, 10 Drawing Sheets

THIN FILM TRANSISTOR AND METHOD OF FABRICATING THE SAME

CROSS-REFERENCE TO RELATED APPLICATIONS

This application claims the benefit of Korean Application No. 2006-111189, filed Nov. 10, 2006, in the Korean Intellectual Property Office, the disclosure of which is hereby incorporated herein by reference.

BACKGROUND OF THE INVENTION

1. Field of the Invention

Aspects of the present invention relate to a thin film transistor and a method of fabricating the same. More particularly, aspects of the present invention relate to a thin film transistor including a semiconductor layer with crystal grains of constant directivity to minimize the characteristic dispersion depending on the crystal grain state, and a method of fabricating the same.

2. Description of the Related Art

Cathode-ray tubes (CRT) have been superseded by flat panel display devices (FPD) that can be fabricated to be lightweight and thin. Typical examples of FPDs are a liquid crystal display device (LCD) and an organic light emitting diode (OLED) display device. The OLED display device has a higher luminance and a wider viewing angle than the LCD and may be made ultra-thin, since an OLED display device does not need a backlight.

In an OLED display device, electrons and holes are injected through a cathode and an anode, respectively, and recombine in an organic thin layer to form excitons. The OLED emits light in a specific wavelength range due to energy created by the excitons.

OLED display devices may be classified into a passive matrix (PM) type and an active matrix (AM) type depending on the driving method. The AM-type OLED display device includes a circuit that uses a thin film transistor (TFT). The PM-type OLED display device, on the other hand, does not include a TFT driving circuit and may be easily fabricated since the display region comprises a simple matrix-type arrangement with anodes and cathodes. However, the application range of PM-type OLED display devices is restricted to low-resolution small-sized display devices owing to problems of resolution, a high driving voltage, and a shortened life span of materials. In AM-type OLED display devices, each pixel of the display device includes a TFT, which means that a constant amount of current can be supplied to each pixel to obtain stable luminance. Also, since AM-type OLED display devices consume low power, AM-type OLED display devices can be high-resolution large-sized display devices.

A TFT generally includes a semiconductor layer having a source region, a drain region and a channel region, a gate electrode, a gate insulating layer, a source electrode, and a drain electrode. The semiconductor layer may be formed of polycrystalline silicon (poly-Si) or amorphous silicon (a-Si). However, electron mobility of polycrystalline silicon is higher than that of amorphous silicon, so polycrystalline silicon is usually employed.

Forming a semiconductor layer made of polycrystalline silicon is generally accomplished by forming amorphous silicon on a substrate and then crystallizing the same. Crystallization methods that can be used include solid phase crystallization (SPC), rapid thermal annealing (RTA), metal induced crystallization (MIC), metal induced lateral crystallization (MILC), a crystallization method using a laser, and similar methods.

In a laser crystallization method, a laser beam is turned on for 30 ns to 200 ns to instantaneously melt the amorphous silicon, and then the melted silicon is cooled and crystallized. This method has the advantage that the thermal effect on the substrate can be minimized and a semiconductor layer having good crystallinity can be formed. Two types of laser crystallization methods are excimer laser annealing (ELA) and sequential lateral solidification (SLS), in which a laser beam is typically irradiated on the amorphous silicon at least two times in order to have crystal grains laterally grown and crystallized.

However, the laser crystallization method does not allow for the crystal grains of the polycrystalline silicon to have constant directivity, but rather, crystal grain boundaries between the crystal grains are non-uniformly distributed. Since the crystal grain boundaries affect characteristics such as electron mobility of TFTs using polycrystalline silicon, the characteristic dispersion of the TFT disadvantageously occurs due to the distribution of the non-uniform crystal grain boundaries when the polycrystalline silicon is formed by the laser crystallization method.

SUMMARY OF THE INVENTION

Aspects of the present invention provide a thin film transistor including a semiconductor layer with crystal grains of a constant directivity to minimize the characteristic dispersion depending on the crystal grain state, and a method of fabricating the same.

According to an aspect of the present invention, a TFT comprises: a substrate; a semiconductor layer disposed on the substrate, and including polycrystalline silicon having constant directivity and uniformly distributed crystal grain boundaries; a gate insulating layer disposed on the semiconductor layer; a gate electrode disposed on the gate insulating layer; an interlayer insulating layer disposed on the gate electrode; and source and drain electrodes disposed on the interlayer insulating layer.

According to another aspect of the present invention, a method of fabricating a TFT comprises: preparing a substrate including a first region, a second region, and a third region; forming an amorphous silicon layer on the first region, second region, and third region of the substrate; doping a first impurity containing boron into an amorphous silicon layer of the first region; forming a crystallization inducing material on the amorphous silicon layer of the first region; applying crystallization energy to the amorphous silicon layer, and crystallizing the amorphous silicon layers of the first region and the second region adjacent to the first region to form polycrystalline silicon layers; crystallizing the amorphous silicon layer of the third region adjacent to the second region to form a polycrystalline silicon layer using a laser crystallization method; and patterning the polycrystalline silicon layers of the first region, the second region, and the third region to form a semiconductor layer on the third region.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A TFT according to an embodiment of the present invention includes a semiconductor layer formed of polycrystalline silicon having constant directivity. In order to make the polycrystalline silicon with constant directivity, a P type dopant containing boron is formed in a predetermined region of amorphous silicon, and the doped predetermined region is then used as a seed of the amorphous silicon to be crystallized by a laser crystallization method such as an SLS method or a thin beam directional crystallization (TDX) method.

Figure 1A:
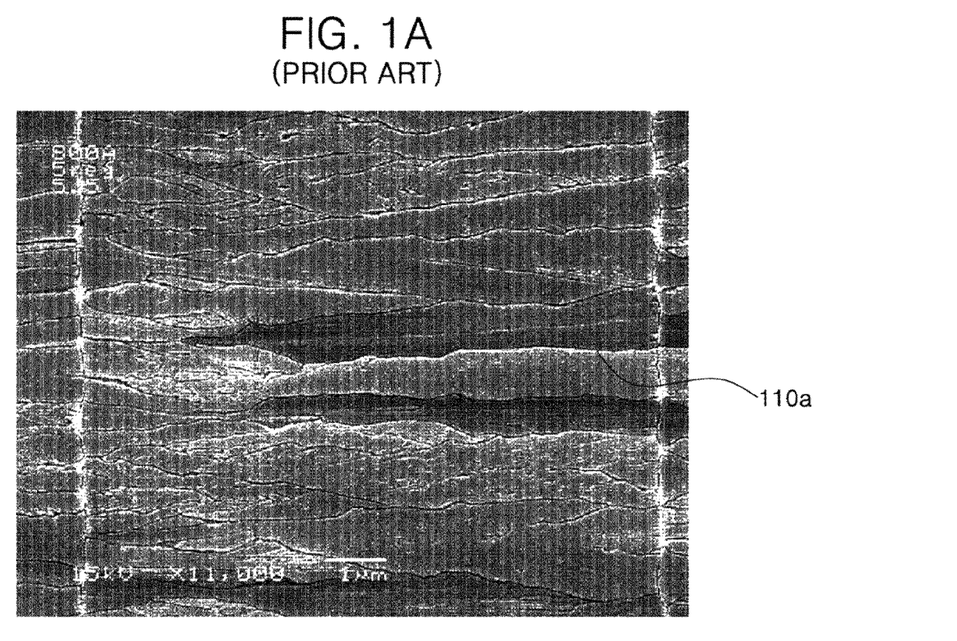
FIG. 1A illustrates a crystallization state according to a conventional SLS method.
Figure 1B:
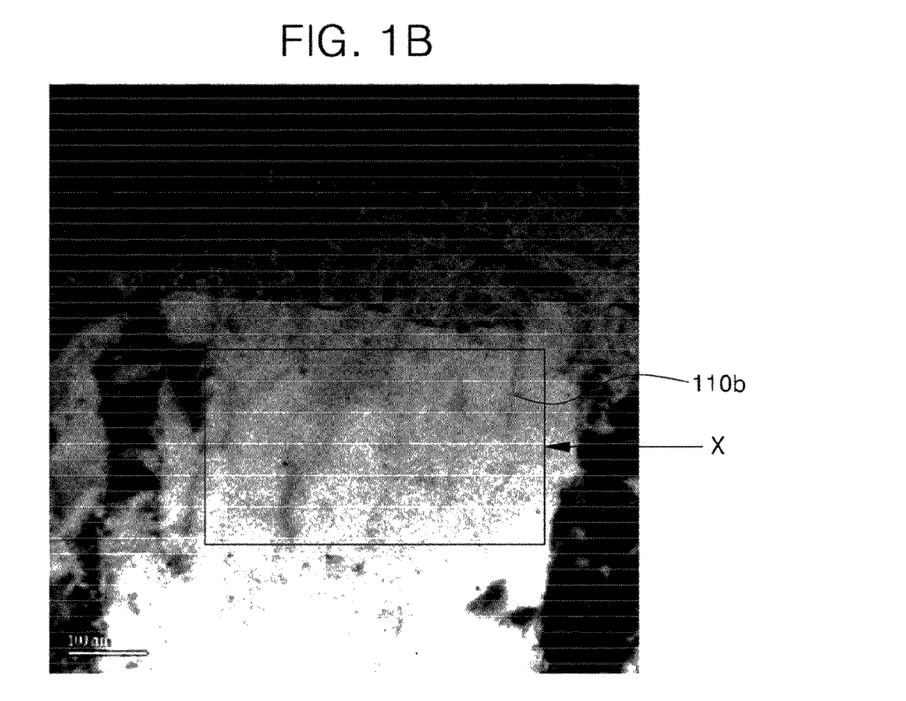
FIG. 1B illustrates a crystallization state after boron is doped.

FIG. 1A illustrates a crystallization state according to a conventional SLS method, and FIG. 1B illustrates a crystallization state achieved after boron doping.

In a general SLS method, a first laser beam is irradiated on an amorphous silicon layer formed on a substrate through a mask pattern including a transmissive region and a non-transmissive region so that the amorphous silicon corresponding to the transmissive region of the mask pattern is melted by the irradiated laser beam, and the amorphous silicon corresponding to the non-transmissive region is not irradiated by the laser beam and thus is not melted.

Subsequently, crystallization first occurs at an interface between the silicon melted by the first laser irradiation and the amorphous silicon which is not melted, and the melted silicon is cooled toward the central direction of the melted silicon, so that the polycrystalline silicon formed by the crystallization is laterally grown. Accordingly, the crystal grain of the polycrystalline silicon has a cylindrical shape and forms a secondary crystal grain boundary toward the crystal grain growth direction between adjacent growing crystal grains, and forms a primary crystal grain boundary toward a direction vertical to the crystal grain growth direction between growing crystal grains facing each other in a central portion of the melted silicon layer.

Subsequently, the mask pattern is moved so that the already crystallized part of the polycrystalline silicon and the amorphous silicon that is not melted by the first laser irradiation correspond to the transmissive region of the mask pattern, and second laser irradiation is performed thereon. The amorphous silicon and the polycrystalline silicon are melted by the second laser irradiation, and then cooled so that silicon atoms are attached on the crystal grain of the polycrystalline silicon that is formed by the first laser irradiation and is not melted by the mask pattern, and thus, the length of the crystal grain increases.

Referring to FIG. 1A, however, the crystallization state according to a conventional SLS method does not have a constant growth direction, which causes a collision between the crystal grains to occur frequently, so that a secondary crystal grain boundary 110a is non-uniformly generated.

Referring to FIG. 1B, the crystallization state of region X doped with boron has a constant growth direction, which does not cause a collision between the crystal grains when the crystal grains grow, so that a secondary crystal grain boundary 110b is constantly formed in each region. In more detail, the crystal grains of the region X doped with boron grow in a (111) direction with respect to a contact surface between the substrate and the amorphous silicon and an axis vertical to the contact surface, and the second crystal grain boundary 110b is also formed in the (111) direction as all crystal grains grow in the (111) direction, so that the secondary crystal grain boundary 110b is constantly formed in each region.

Herein, the above-described principle is used to form polycrystalline silicon having a constant directivity by doping boron into a predetermined region of the amorphous silicon and performing a laser crystallization method such as an SLS or TDX using the polycrystalline silicon as a seed, thereby forming polycrystalline silicon having constant directivity, uniformly distributed crystal grain boundaries, and good characteristics.

Exemplary Embodiment

FIG. 2A to 2D are cross-sectional views illustrating a method of fabricating a TFT according to an exemplary embodiment of the present invention.

Figure 2A:
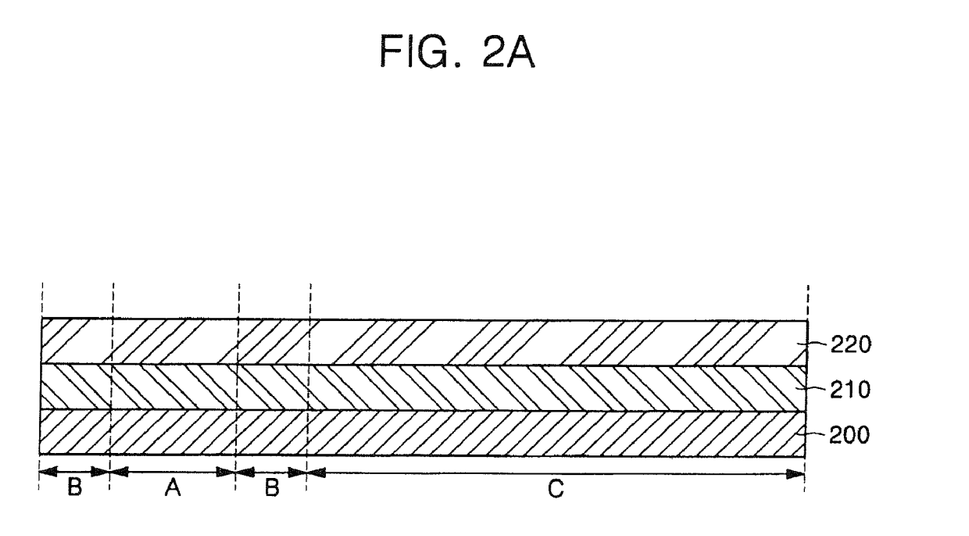
FIGS. 2A to 2D are cross-sectional views illustrating a method of fabricating a TFT according to an embodiment of the present invention.

Referring to FIG. 2A, a buffer layer 210, which includes a first region A, a second region B, and a third region C, is formed on a substrate 200 made of glass, synthetic resin, stainless steel or the like, and an amorphous silicon layer 220 is formed on the buffer layer 210. Here, the buffer layer 210 may be formed of a silicon nitride ($SiN_x$) layer, a silicon oxide ($SiO_2$) layer, or a stacked layer thereof. The buffer layer 210 serves to prevent impurities on the substrate 200 from diffusing while crystallizing the amorphous silicon layer 220. However, the buffer layer 210 may be omitted.

Figure 2B:
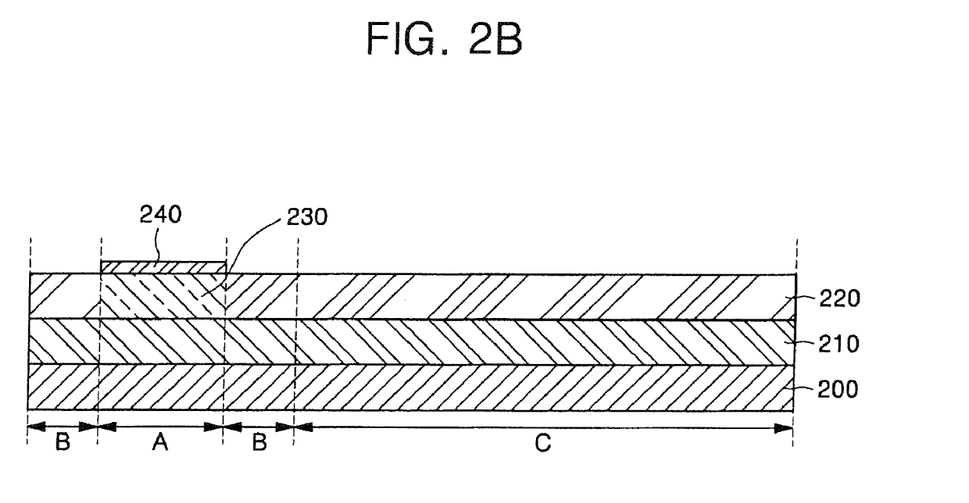

Subsequently, as shown in FIG. 2B, a first impurity containing boron is doped into a amorphous silicon layer 230 of the first region A, and a crystallization inducing material 240 is formed on the amorphous silicon layer 230 doped with the first impurity. Here, the first impurity may be boron or a P-type dopant containing boron, and the doping of the first impurity may be performed by an ion implantation method or an ion shower method.

The crystallization inducing material 240 may be a metal material such as Ni, Pd, Ti, Ag, Au, Al, Sn, Sb, Cu, Co, Cr, Mo, Tr, Ru, Rh, Cd or Pt. As a specific, non-limiting example, Ni or Pd may be used as the crystallization inducing material 240. The crystallization inducing material 240 may be formed to a thickness of 1 Å to 10,000 Å in order to induce crystallization of the amorphous silicon layer 220 of the second region B adjacent to the first region A where the crystallization inducing material 240 is formed by the subsequent process of crystallizing the amorphous silicon layers 220 and 230. As a specific non-limiting example, the crystallization inducing material may have a thickness of 10 Å to 200 Å

A second impurity may be doped into the amorphous silicon layer 220 of the third region C before or after the first impurity is doped into the amorphous silicon layer 230 of the first region A. The second impurity may be a P-type dopant, and when the second impurity is the same as the first impurity, the process of doping the second impurity may be simultaneously performed while the process of doping the first impurity is performed. In addition, the amorphous silicon layers of the first region, the second region, and the third region may be doped with the first impurity for simplicity of process.

Figure 2C:
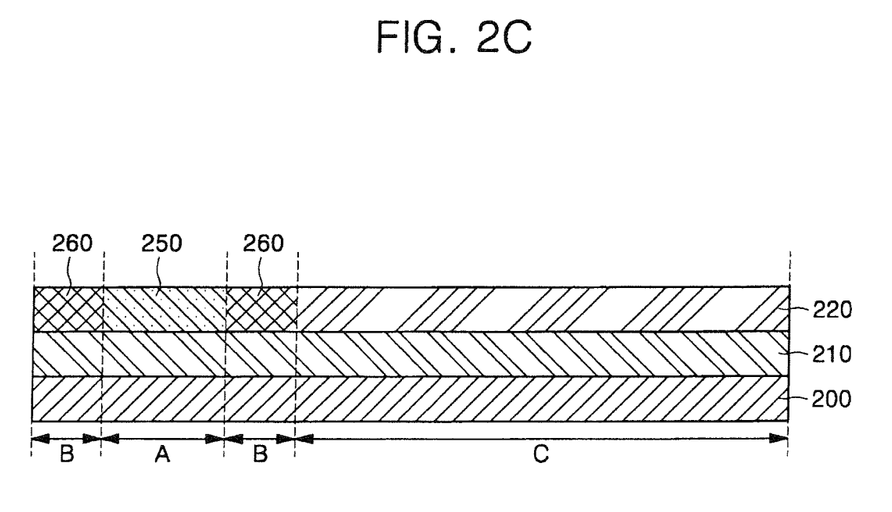

Subsequently, as shown in FIG. 2C, crystallization energy is applied to the amorphous silicon layer 220 to crystallize the amorphous silicon layers 230 and 220 of the first region A and the second region B adjacent to the first region A to form polycrystalline silicon layers 250 and 260. The crystallization energy may be applied using a heating method using a furnace, laser or microwave, or an RTA method. As a non-limiting example, the heating method may be performed for 0.5 to 20 hours at a temperature of 300° C. to 700° C. in a furnace.

Here, the amorphous silicon layers 230 and 220 of the first region A and the second region B are crystallized to form the polycrystalline silicon layers 250 and 260 by the crystallization inducing material 240 formed on the amorphous silicon layer 230 of the first region A. The polycrystalline silicon layers 250 and 260 have a constant directivity due to the effects of boron doped into the amorphous silicon layer 230 of the first region A. Specifically, the polycrystalline silicon layers 250 and 260 have crystal grains having a direction of (111) due to the effects of doped boron with respect to a contact surface between the substrate or the buffer layer and the polycrystalline silicon layer and an axis vertical to the contact surface.

Figure 2D:
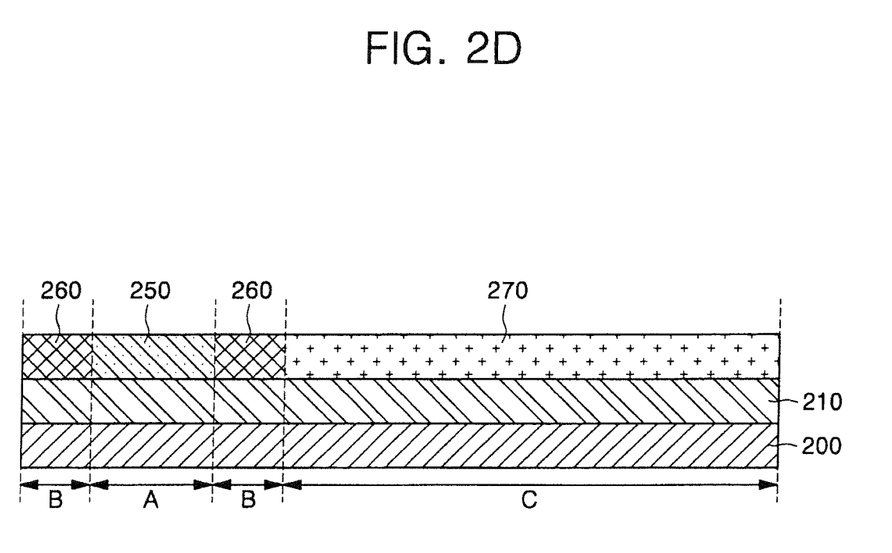

Subsequently, as shown in FIG. 2D, the amorphous silicon layer 220 of the third region C adjacent to the second region B is crystallized by an SLS method. The SLS method uses crystal grains of the polycrystalline silicon layer 260 of the adjacent second region B as a seed to continuously grow the crystal grains, so that the amorphous silicon layer 220 of the third region C, using the crystal grains of the polycrystalline silicon layer 260 of the second region B as the seed, is crystallized to a polycrystalline silicon layer 270 having a constant directivity, uniformly distributed crystal grain boundaries, and good characteristics. As a non-limiting example, the third region C may be crystallized by the SLS method as described. However, the third region C may also be crystallized by the TDX method or the like to obtain the same effect.

Subsequently, the polycrystalline silicon layers 250, 260, 270 of the first region A, the second region B, and the third region C may be patterned to form a semiconductor layer on the third region C, and a gate insulating layer, a gate electrode, an interlayer insulating layer, and source and drain electrodes on the semiconductor layer, thereby forming a thin film transistor. A third impurity is doped into a predetermined region of the semiconductor layer to form source and drain regions and a channel region. The third impurity is preferably an N-type dopant when the first or second impurity is a P-type dopant, while the amorphous silicon of the third region is already doped with the first or second impurity by the previous process. In addition, the concentration of the third impurity may be $1\times10^{-12}$ cm$^2$ to $5\times10^{-22}$ cm$^2$. As a non-limiting example, the concentration of the third impurity may be higher than that of the first or second impurity in order to form the source and drain regions and the channel region of the semiconductor layer using the third impurity.

Table 1 shows crystallization speeds of the amorphous silicon of the first region depending on the thermal treatment temperature in the process of applying crystallization energy to the amorphous silicon of the first region and the concentration of boron doped into the amorphous silicon of the first region in the method of fabrication the TFT according to exemplary embodiments of the present invention.

TABLE 1

| Temperature | Concentration | | |
|---|---|---|---|
| | 0 | $1 \times 10^{15}/cm^2$ | $5 \times 10^{15}/cm^2$ |
| 500° C. | 1.4 μm/hr | 2.7 μm/hr | 2.8 μm/hr |
| 550° C. | 13.5 μm/hr | 26.5 μm/hr | 26.8 μm/hr |

Referring to Table 1, it can be seen that the crystallization speed significantly changes depending on the thermal treatment temperature and whether the boron is doped into the amorphous silicon of the first region. On the other hand, the crystallization speed hardly changes with respect to the change in concentration of the boron.

Accordingly, in the method of fabricating the TFT, the concentration of the boron doped into the amorphous silicon of the first region may be extremely low. However, when the first impurity containing boron is simultaneously doped into the amorphous silicon of the third region as well as the amorphous silicon of the first region, a region doped with the first impurity may be a channel region of the semiconductor layer to be formed by crystallizing the amorphous silicon of the third region, so that the concentration of the first impurity may be, as a non-limiting example, $1\times12^{-12}$ cm$^2$ to $5\times12^{-15}$ cm$^2$, which is lower than the concentration of the third impurity to be doped to form the source and drain regions of the semiconductor layer.

Figure 3A:
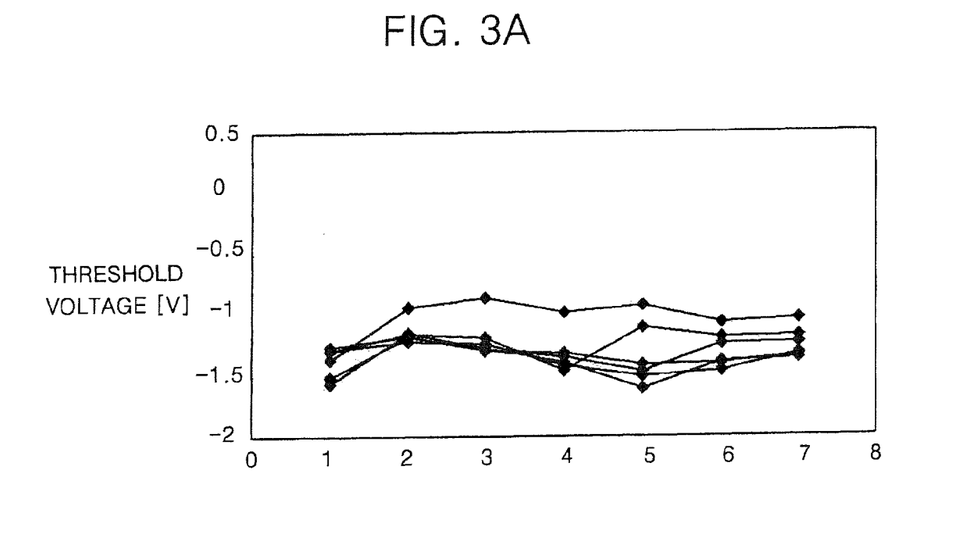
FIGS. 3A and 3B are graphs illustrating threshold voltages of a TFT according to a conventional crystallization method and FIGS. 3C and 3D are graphs illustrating threshold voltages of a TFT according to an embodiment of the present invention.
Figure 3B:
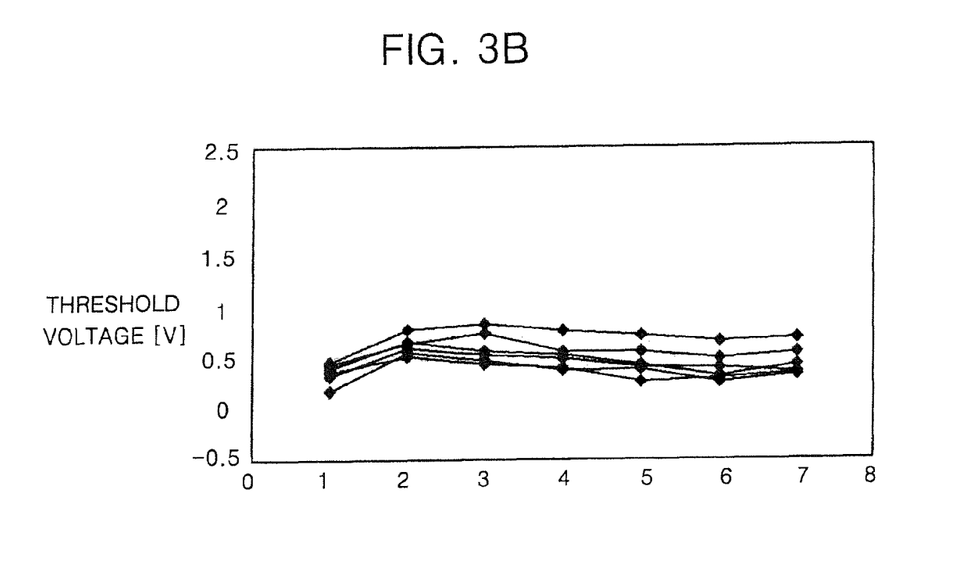
Figure 3C:
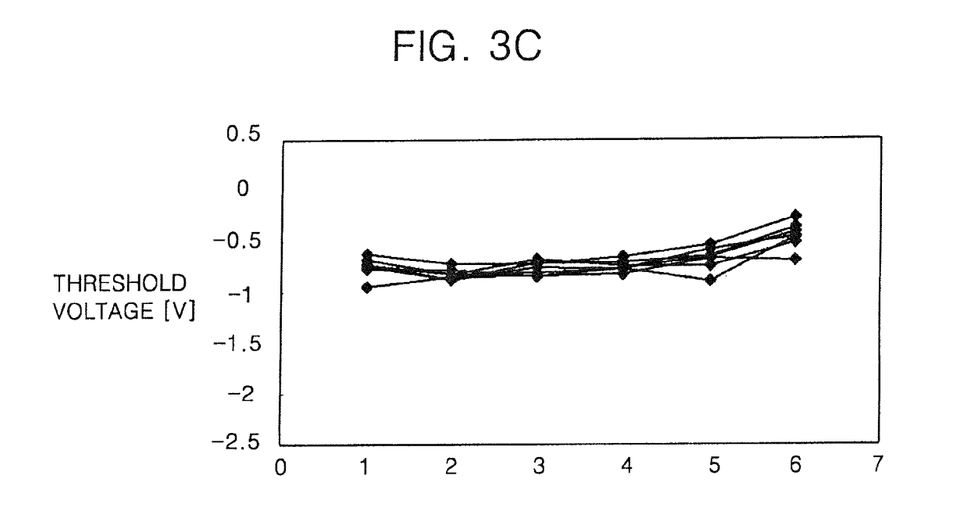
Figure 3D:
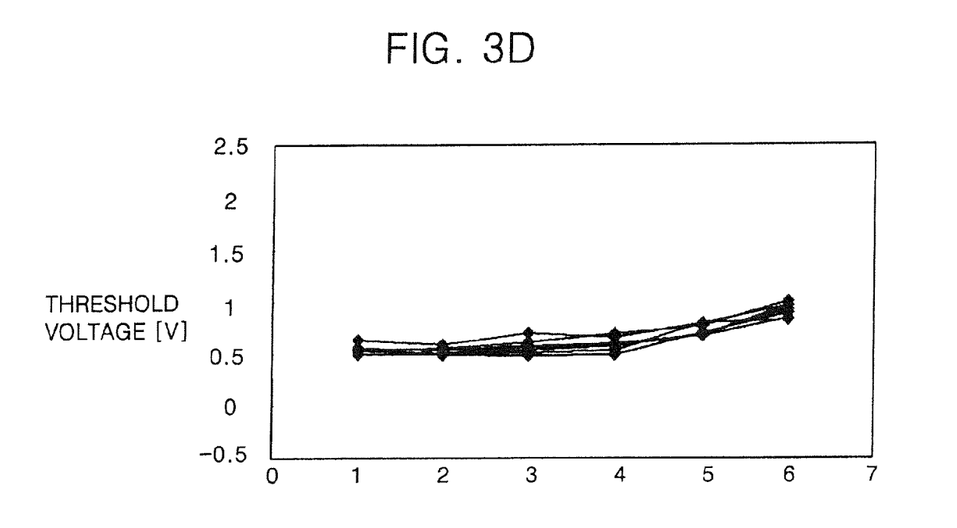
Figure 4A:
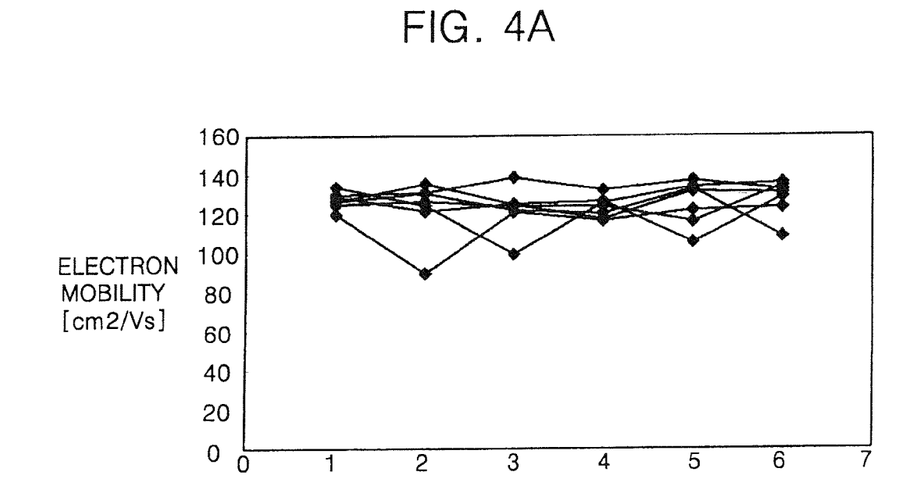
FIGS. 4A and 4B are graphs illustrating electron mobilities of a TFT according to a conventional crystallization method and FIGS. 4C and 4D are graphs illustrating electron mobilities of a TFT according to an embodiment of the present invention.
Figure 4B:
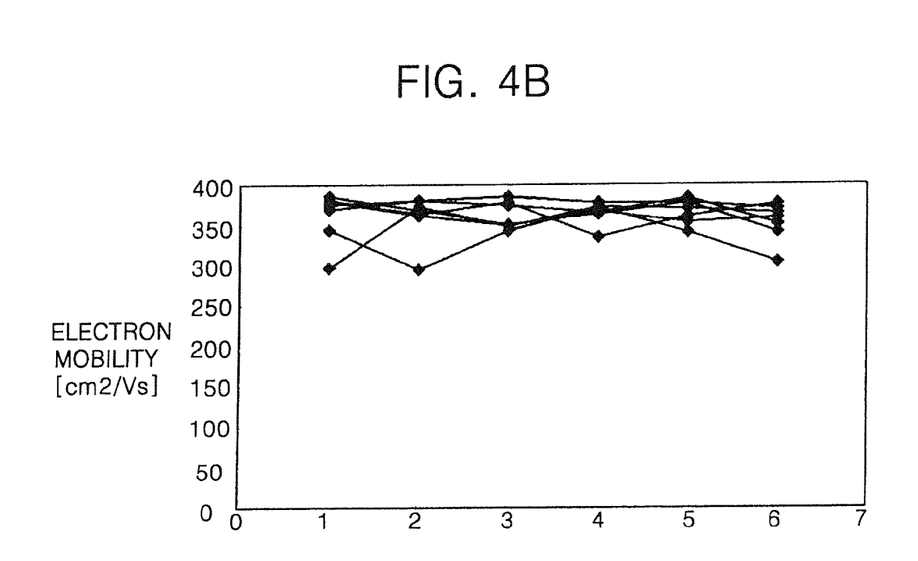
Figure 4C:
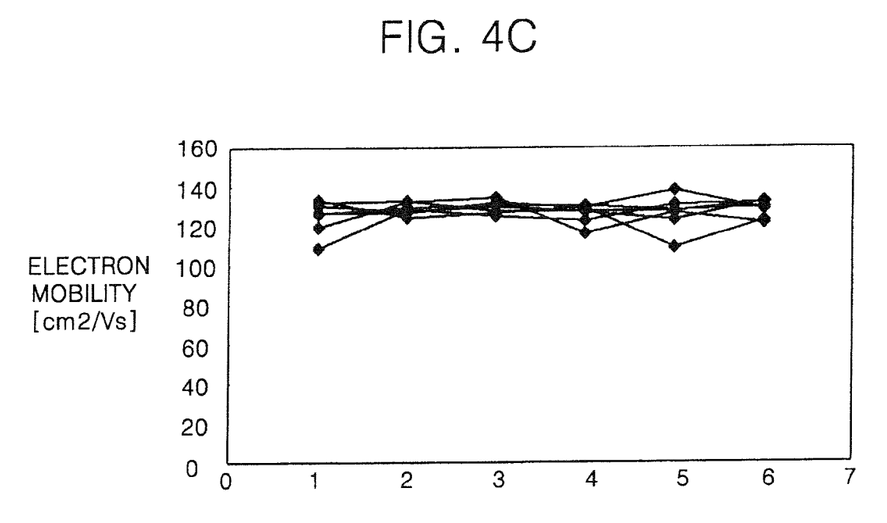
Figure 4D:
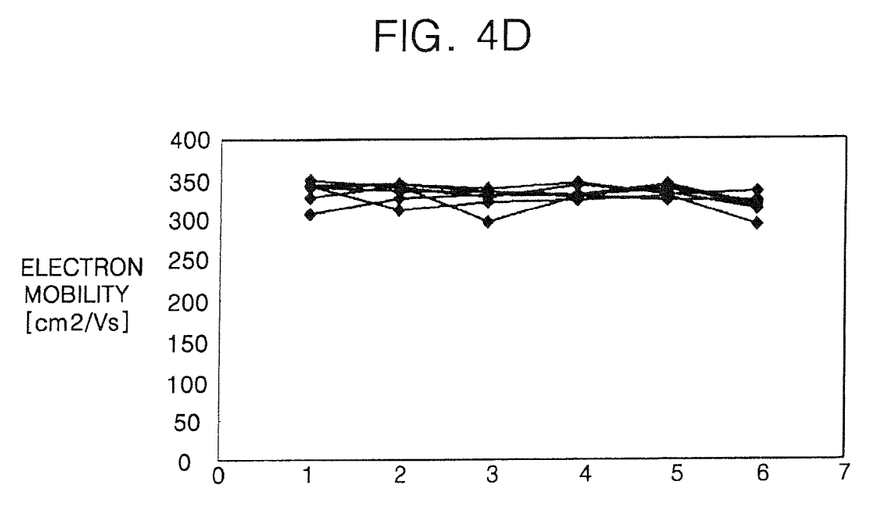
Figure 5A:
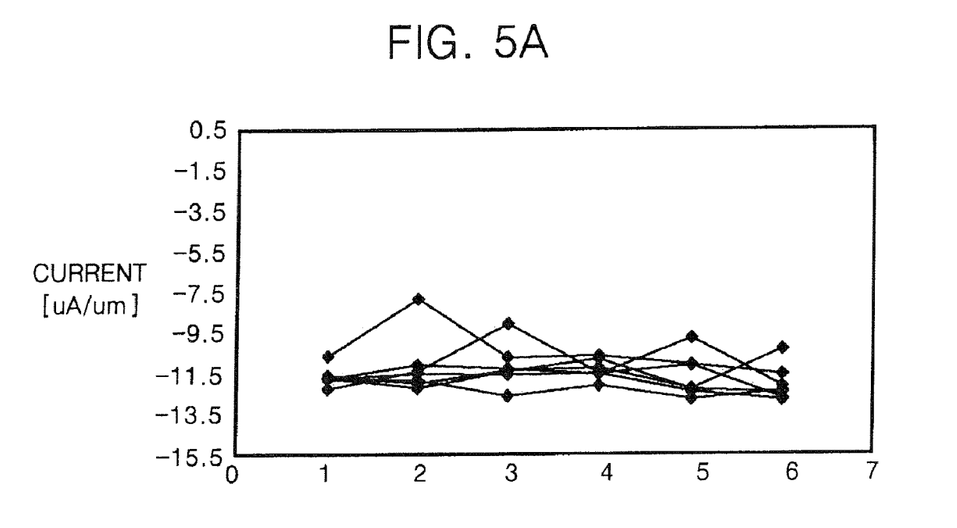
FIGS. 5A and 5B are graphs illustrating current values of a TFT according to a conventional crystallization method and FIGS. 5C and 5D are graphs illustrating current values of a TFT according to an embodiment of the present invention.
Figure 5B:
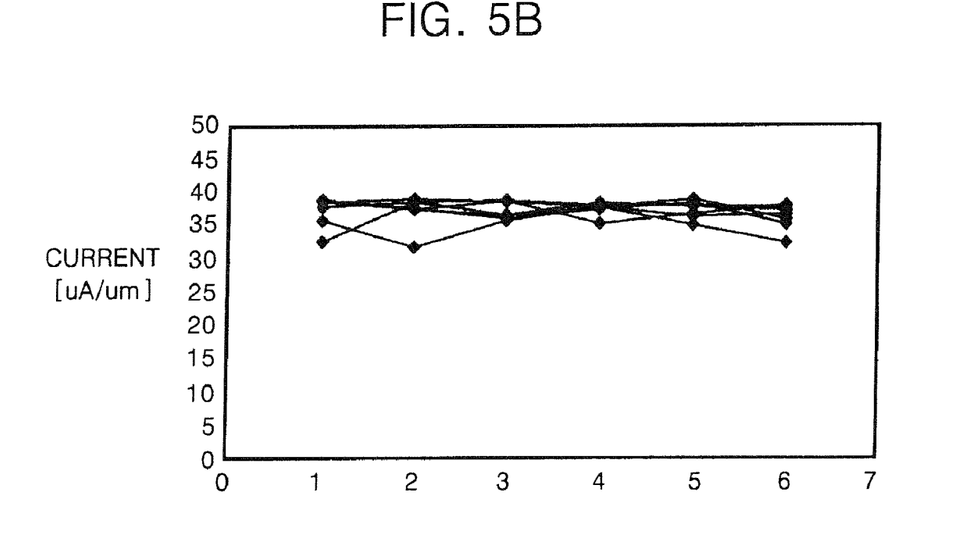
Figure 5C:
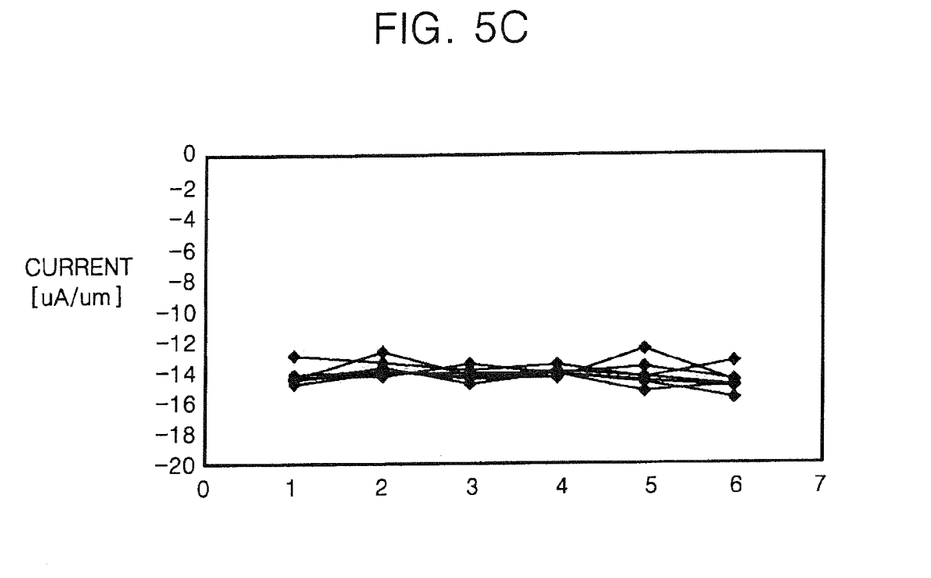
Figure 5D:
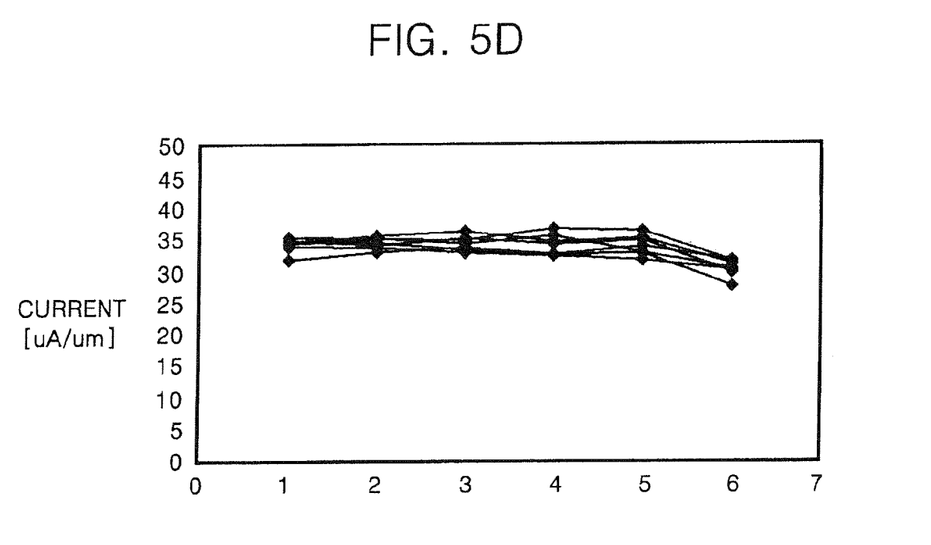

FIGS. 3A and 3B are graphs showing threshold voltage measurements of the TFTs on several regions of a semiconductor layer formed according to a conventional crystallization method, and FIGS. 3C and 3D are graphs showing threshold voltage measurements of the TFTs on several regions of a semiconductor layer formed according to embodiments of the present invention.

Referring to FIGS. 3A, 3B, 3C and 3D, it can be seen that the characteristic dispersion of the threshold voltages of the TFT formed according to the embodiments of the present invention decreases in each region, compared to the characteristic dispersion of the threshold voltages of the TFT formed according to the conventional crystallization method.

FIGS. 4A, 4B, 5A and 5B are graphs showing electron mobilities and current values of the TFT on the same regions of the substrate used in FIG. 3A and FIG. 3B according to the conventional crystallization method, and FIGS. 4C, 4D, 5C and 5D are graphs showing electron mobilities and current values of the TFT on the same regions of the substrate used in FIG. 3C and FIG. 3D according to the embodiments of the present invention.

Referring to FIGS. 4A-4D and FIGS. 5A-5D, it can also be seen that the characteristic dispersion of the TFT according to the embodiments of the present invention decreases compared to the TFT according to the conventional crystallization method in terms of the electron mobility and the current value as well as the threshold voltage of the above-described TFT.

Figure 6:
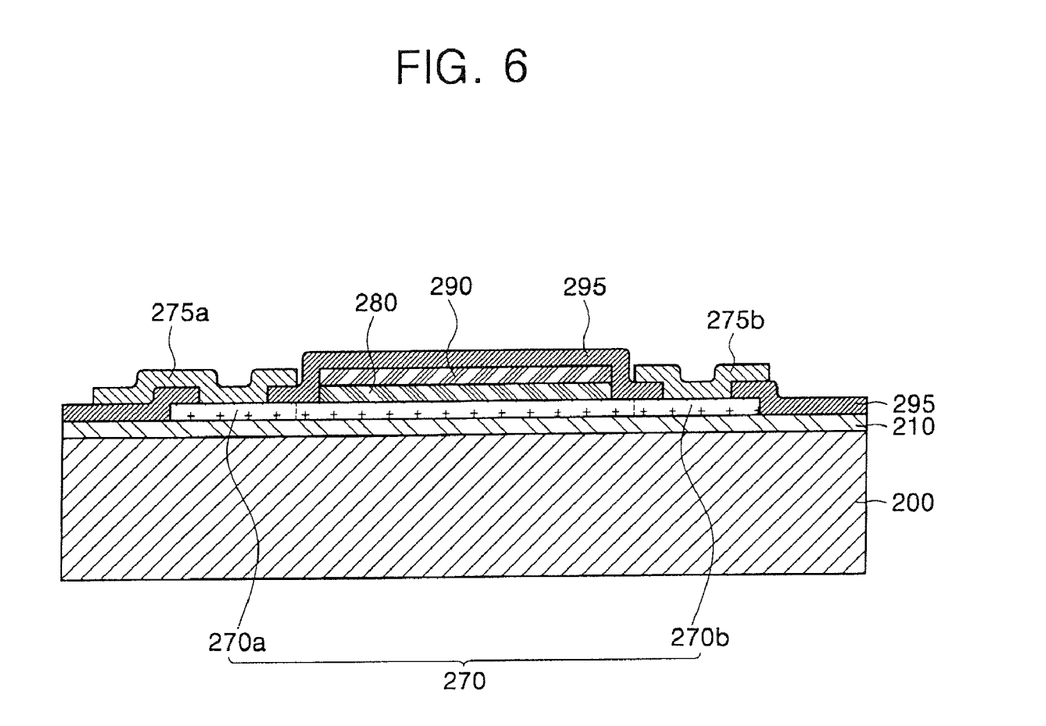
FIG. 6 is a schematic representation of a thin film transistor 20 according to an embodiment of the present invention.

FIG. 6 is a schematic representation of a thin film transistor according to an embodiment of the present invention including a substrate 200, an optional buffer layer 210; a semiconductor layer 270 disposed on the substrate, and including polycrystalline silicon having constant directivity and uniformly distributed crystal grain boundaries and having a source region 270a, a drain region 270b and a channel region 270c; a gate insulating layer 280 disposed on the semiconductor layer 270; a gate electrode 290 disposed on the gate insulating layer; an interlayer insulating layer 295 disposed on the gate electrode; and source and drain electrodes 275a and 275b disposed on the interlayer insulating layer. It is to be understood that when it is stated herein that a first layer is "disposed on" a second layer, the first layer may be formed directly on the second layer or there may be an intervening layer between the first layer and the second layer.

Consequently, according to the TFT and method of fabricating the same according to aspects of the present invention, impurities containing boron are doped into a predetermined region of the amorphous silicon, the amorphous silicon doped with the impurity is crystallized to form polycrystalline silicon having crystal grains of constant directivity, and a laser crystallization method using the polycrystalline silicon as a seed is performed to form a polycrystalline silicon having constant directivity, uniformly distributed crystal grain boundaries, and good characteristics. The semiconductor layer of the TFT is formed of the polycrystalline silicon, thereby minimizing the characteristic dispersion of the TFT.

Therefore, in a TFT according to embodiments of the present invention and a method of fabricating the same, an impurity containing boron is used to form polycrystalline silicon having constant directivity, uniformly distributed crystal grain boundaries, and good characteristics, so that the TFT having good characteristics and decreased characteristic dispersion can be fabricated.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a thin film transistor (TFT), comprising:
   preparing a substrate including a first region, a second region adjacent to the first region, and a third region adjacent to the second region;
   forming an amorphous silicon layer on the first region, second region, and third region of the substrate;
   doping a first impurity containing boron into the amorphous silicon layer of the first region;
   forming a crystallization inducing material on the amorphous silicon layer of the first region;
   applying crystallization energy to the amorphous silicon layer, and crystallizing the amorphous silicon layers of the first region, doped with the first impurity containing boron and having the crystallization inducing material formed thereon, and the second region adjacent to the first region to form polycrystalline silicon layers of the first and second regions;
   crystallizing the amorphous silicon layer of the third region adjacent to the polycrystalline silicon layer of the second region to form a polycrystalline silicon layer of the third region using a laser crystallization method; and
   patterning the polycrystalline silicon layers of the first region, the second region, and the third region to form a semiconductor layer from the polycrystalline silicon layer of the third region.

2. The method according to claim 1, wherein the crystallization inducing material comprises at least one selected from a group consisting of Ni, Pd, Ti, Ag, Au, Al, Sn, Sb, Cu, Co, Cr, Mo, Tr, Ru, Rh, Cd, and Pt.

3. The method according to claim 1, wherein the crystallization inducing material is formed to a thickness of 10 Å to 200 Å.

4. The method according to claim 1, wherein the crystallization energy is applied using a furnace, laser microwave or rapid thermal annealing (RTA) system.

5. The method according to claim 1, wherein the crystallizing of the amorphous silicon layer of the third region to form a polycrystalline silicon layer using a laser crystallization method comprises using a sequential lateral solidification (SLS) crystallization method.

6. The method according to claim 1, wherein the first impurity has a concentration of $1 \times 10^{-12}$ cm$^2$ to $5 \times 10^{-15}$ cm$^2$.

7. The method according to claim 1, further comprising:
   doping a second impurity into the amorphous silicon layer of the third region.

8. The method according to claim 7, wherein the second impurity is the same material as the first impurity, and wherein the doping of the second impurity into the amorphous silicon layer of the third region is performed simultaneously with the doping of the first impurity into the amorphous silicon layer of the first region.

9. The method according to claim 7, wherein the second impurity is a P-type dopant.

10. The method according to claim 9, further comprising:
    doping a third impurity into a predetermined region of the semiconductor layer on the third region to form source and drain regions and a channel region.

11. The method according to claim 10, wherein the third impurity is an N-type dopant.

12. The method according to claim 11, wherein the N-type dopant has a concentration of $1 \times 10^{-12}$ cm$^2$ to $5 \times 10^{-22}$ cm$^2$.

13. The method according to claim 9, wherein the third impurity has a concentration higher than that of the first impurity.

14. The method according to claim 1, wherein the first impurity comprises boron.

15. The method according to claim 1, wherein the amorphous silicon layers of the second and third regions are doped with the first impurity when the amorphous silicon layer of the first region is doped with the first impurity.

16. The method according to claim 1, wherein the first impurity is doped into the amorphous silicon layer of the first region by ion implantation or ion shower.

* * * * *